US008980504B2

(12) United States Patent
Bala et al.

(10) Patent No.: US 8,980,504 B2
(45) Date of Patent: Mar. 17, 2015

(54) SUBSTRATE FLUORESCENCE MASK UTILIZING A MULTIPLE COLOR OVERLAY FOR EMBEDDING INFORMATION IN PRINTED DOCUMENTS

(75) Inventors: Raja Bala, Webster, NY (US); Reiner Eschbach, Webster, NY (US)

(73) Assignee: Xerox Corporation, Norwalk, CT (US)

(*) Notice: Subject to any disclaimer, the term of this patent is extended or adjusted under 35 U.S.C. 154(b) by 1586 days.

(21) Appl. No.: 11/708,313

(22) Filed: Feb. 20, 2007

(65) Prior Publication Data

US 2008/0199785 A1 Aug. 21, 2008

(51) Int. Cl.
*G03F 1/00* (2012.01)
*B41M 3/14* (2006.01)

(52) U.S. Cl.
CPC *B41M 3/144* (2013.01); *B41M 3/14* (2013.01)
USPC ........................ 430/6; 430/4; 430/5; 101/483

(58) Field of Classification Search
USPC ....................................... 430/5, 6, 4; 101/483
See application file for complete search history.

(56) References Cited

U.S. PATENT DOCUMENTS

| | | | | |
|---|---|---|---|---|
| 3,614,430 | A | 10/1971 | Berler | |
| 3,900,608 | A | 8/1975 | Dierkes et al. | |
| 4,186,020 | A | 1/1980 | Wachtel | |
| 4,374,643 | A | 2/1983 | Suzuk et al. | |
| 4,384,069 | A | 5/1983 | Wendel et al. | |
| 5,169,155 | A * | 12/1992 | Soules et al. | 273/293 |
| 5,256,192 | A | 10/1993 | Liu et al. | |
| 5,286,286 | A | 2/1994 | Winnik et al. | |
| 5,371,126 | A | 12/1994 | Strickler | |
| 5,734,752 | A | 3/1998 | Knox | |
| 6,106,021 | A | 8/2000 | Phillips | |
| 6,373,965 | B1 | 4/2002 | Liang | |
| 6,773,549 | B1 * | 8/2004 | Burkhardt | 162/137 |
| 6,969,445 | B1 | 11/2005 | Hibino et al. | |
| 2,584,397 | A1 | 4/2006 | Yoshida | |

(Continued)

FOREIGN PATENT DOCUMENTS

| | | |
|---|---|---|
| AU | 5236073 | 8/1974 |
| JP | 2194989 | 8/1990 |

(Continued)

OTHER PUBLICATIONS

U.S. Appl. No. 11/382,897, filed May 11, 2006, Bala.

(Continued)

*Primary Examiner* — Bruce H Hess
*Assistant Examiner* — Christopher Polley
(74) *Attorney, Agent, or Firm* — MH2 Technology Law Group LLP

(57) ABSTRACT

A method is provided for creation of a substrate fluorescence mask having background color(s), UV mark color(s), and distraction color(s), to be printed as an image on a substrate containing optical brightening agents. The method includes selecting one or more UV mark colors for the mask such that the UV mark colors exhibit low contrast against the background color(s) under normal illumination and high contrast against the background color(s) under UV illumination. One or more distraction colors are also selected, such that the distraction color(s) exhibit low contrast against the background color(s) under UV illumination and exhibit high contrast against the background color(s) under normal illumination. A distraction pattern, formed from one or more distraction colors, is also selected.

20 Claims, 4 Drawing Sheets

(56) References Cited

U.S. PATENT DOCUMENTS

| | | | | |
|---|---|---|---|---|
| 7,127,112 | B2 | 10/2006 | Sharma et al. | |
| 2003/0005304 | A1 | 1/2003 | Lawandy et al. | |
| 2003/0039195 | A1 * | 2/2003 | Long et al. | 369/103 |
| 2004/0071359 | A1 * | 4/2004 | Sharma et al. | 382/254 |
| 2004/0233465 | A1 | 11/2004 | Coyle et al. | |
| 2005/0078851 | A1 | 4/2005 | Jones et al. | |
| 2005/0262351 | A1 * | 11/2005 | Levy | 713/176 |

FOREIGN PATENT DOCUMENTS

| | | |
|---|---|---|
| JP | 2000211247 | 8/2000 |
| WO | 03044278 | 5/2003 |
| WO | 2006027418 | 3/2006 |

OTHER PUBLICATIONS

U.S. Appl. No. 11/382,869, filed May 11, 2006, Bala.

Hunt, R.W.G., *Measuring Colour*, Ellis Horwood, 1991.

Billmeyer and Saltzman, *Principles of Color Technology*, 3rd Ed. (Roy S. Berns), John Wiley & Sons, 2000.

* cited by examiner

SUBSTRATE FLUORESCENCE MASK UTILIZING A MULTIPLE COLOR OVERLAY FOR EMBEDDING INFORMATION IN PRINTED DOCUMENTS

CROSS-REFERENCE TO RELATED APPLICATIONS

The following co-pending applications, U.S. application Ser. No. 11/382,897, filed May 11, 2006, titled "Substrate Fluorescence Mask for Embedding Information in Printed Documents", and U.S. application Ser. No. 11/382,869, filed May 11, 2006, titled "Substrate Fluorescence Mask for Embedding Information in Printed Documents", are assigned to the same assignee of the present application. The entire disclosures of these co-pending applications are totally incorporated herein by reference in their entireties.

BACKGROUND AND SUMMARY

This disclosure relates generally to methods and systems for steganographically embedding information, and more particularly to a system and method for utilizing a multiple color overlay in a substrate fluorescence mask to embed information in documents and/or images.

Current counterfeit prevention systems are mainly based on the use of digital watermarks, a technique which permits the insertion of information (e.g., copyright notices, security codes, identification data, etc.) to digital image signals and documents. Such data can be in a group of bits describing information pertaining to the signal or to the author of the signal (e.g., name, place, etc.). Most common watermarking methods for images work in spatial or frequency domains, with various spatial and frequency domain techniques used for adding watermarks to and removing them from signals.

For spatial digital watermarking the simplest method involves flipping the lowest-order bit of chosen pixels in a gray scale or color image. This works well only if the image will not be subject to any human or noisy modification. A more robust watermark can be embedded in an image in the same way that a watermark is added to paper. Such techniques may superimpose a watermark symbol over an area of the picture and then add some fixed intensity value for the watermark to the varied pixel values of the image. The resulting watermark may be visible or invisible depending upon the value (large or small, respectively) of the watermark intensity.

Spatial watermarking can also be applied using color separation. In this approach, the watermark appears in only one of the color bands. This type of watermark is visibly subtle and difficult to detect under normal viewing conditions. However, when the colors of the image are separated for printing or xerography, the watermark appears immediately. This renders the document useless to the printer unless the watermark can be removed from the color band. This approach is used commercially for journalists to inspect digital pictures from a stock photo agency before buying un-watermarked versions.

Alternatively, another approach uses ultra-violet (UV) ink rendering to encode a watermark that is not visible under normal illumination, but revealed under UV illumination. The traditional approach, often used in currency notes, is to render a watermark with special ultra-violet (UV) fluorescent inks and to subsequently identify the presence or absence of the watermark in a proffered document using a standard UV lamp. However, these inks are costly to employ, and thus are typically only economically viable in offset printing scenarios, and thus only truly avail themselves of long print runs. Additionally, these materials are often difficult to incorporate into standard electro-photographic or other non-impact printing systems like solid ink printers, either due to cost, availability or physical/chemical properties. This in turn discourages their use in variable data printing arrangements, such as for redeemable coupons, for example.

There is well established understanding in the printing industry regarding the utilization of fluorescent material inks in combination with ultra-violet light sources as employed for security marks, particularly as a technique to deter counterfeiting. However, there remains a long standing need for an approach to such a technique which will provide the same benefit but with lower complexity and cost, particularly in a digital printing environment, using only common consumables.

All U.S. patents and published U.S. patent applications cited herein are fully incorporated by reference. The following patents or publications are noted:

U.S. Patent Application Publication No. 2005/0078851 to Jones et al. ("Multi-channel Digital Watermarking") describes a system for providing digital watermarks through multiple channels. The channels can include visible, ultraviolet and infrared channels. The non-visible channels can be selected to fluoresce either in the visible or IR/UV spectrums upon the appropriate illumination in the infrared or ultraviolet spectrums. The watermarks in the various multiple channels can cooperate to facilitate watermark detection or to authenticate an object in which the watermarks are embedded.

U.S. Patent Application Publication No. 2003/0005304 to Lawandy et al. ("Marking Articles Using a Covert Digitally Watermarked Image") describes a marking system for marking an article with an image not visible to the unaided human eye, with the image containing at least one digital watermark. The digitally watermarked image includes both emissive and photoabsorptive protions and is applied using a substance reactive to a predetermined excitation source and exposure to ultraviolet light. Alternate techniques, such as printing with fluorescent inks may be used in combination. The digitally watermarked image is subsequently observable upon exposure to the predetermined excitation source.

U.S. Pat. No. 6,373,965 to Liang ("Apparatus and Mehtods for Authentication Using Partially Fluorescent Graphic Images and OCR Characters") teaches a system combining a source of ultraviolet light with apparatus for capturing and recognizing either graphic images or characters, or both. In this patent either a visible sub-image, or a fluorescent sub-image, or a combination image, may further contain steganographic (digital watermark) information that is encoded and inserted using conventional techniques. The digital watermark information may be similarly encoded and inserted into visible and/or fluorescent sub-portions and or recombined OCR characters.

U.S. Pat. No. 7,127,112 to Sharma et al. ("Systems for Spectral Multiplexing of Source Images to Provide a Composite Image, for Rendering the Composite Image, and for Spectral Demultiplexing of the Composite Image by Use of an Image Capture Device") provides methods and systems for spectrally-encoding plural source images and for providing the spectrally-encoded plural source images in a composite image, for rendering the composite image on a substrate, and for recovering at least one of the encoded source images from the rendered composite image. Each source image is spectrally encoded by mapping values representative of each source image pixel to a corresponding pixel value in one or more of a plurality of colorant image planes. The encoding may include the conversion of each source image to a monochromatic, separation image, which is then directly mapped to a corresponding colorant image plane in the composite image. A plurality of source images can thereby be mapped to a corresponding plurality of colorant image planes in the composite image.

The disclosed embodiments provide examples of improved solutions to the problems noted in the above Background discussion and the art cited therein. There is shown in these examples an improved method for creation of a substrate fluorescence mask having background color(s), UV mark color(s), and distraction color(s), to be printed as an image on a substrate containing optical brightening agents. The method includes selecting one or more UV mark colors for the mask such that the UV mark colors exhibit low contrast against the background color(s) under normal illumination and high contrast against the background color(s) under UV illumination. One or more distraction colors are also selected, such that the distraction color(s) exhibit low contrast against the background color(s) under UV illumination and exhibit high contrast against the background color(s) under normal illumination. A distraction pattern, formed from one or more distraction colors, is also selected.

In an alternate embodiment there is disclosed a system for creation of a substrate fluorescence mask to be printed as an image on a substrate for the purpose of embedding information in printed documents. The substrate fluorescence mask includes at least one background color, at least one UV mark color, and at least one distraction color. The system includes a digital printing device for printing the fluorescence mask image on a substrate containing optical brightening agents. The one or more UV mark colors are selected to exhibit low contrast against the background color(s) under normal illumination and high contrast against the background color(s) under UV illumination. The distraction color is chosen to exhibit low contrast against the background color(s) under UV illumination and exhibit high contrast against the background color(s) under normal illumination. One or more distraction patterns are formed from at least one distraction color.

In another embodiment there is disclosed a substrate fluorescence mask to be printed as an image on a substrate containing optical brightening agents in order to embed information in printed documents. The substrate fluorescence mask includes at least one background color, at least one UV mark color, and at least one distraction color. The UV mark color is specified to exhibit low contrast against the background color under normal illumination and high contrast against the background color under UV illumination. The distraction color is specified to exhibit low contrast against the background color under UV illumination and exhibit high contrast against the background color under normal illumination. One or more distraction patterns is also specified, with the distraction pattern formed from at least one distraction color.

In yet another embodiment there is disclosed a computer-readable storage medium having computer readable program code embodied in the medium which, when the program code is executed by a computer, causes the computer to perform method steps for creation of a substrate fluorescence mask having one or more background color(s), one or more UV mark color(s), and one or more distraction color(s), to be printed as an image on a substrate containing optical brightening agents. The method includes selecting background color(s) and also selecting UV mark color(s) for the mask such that the UV mark color(s) exhibits low contrast against the background color(s) under normal illumination and high contrast against the background color(s) under UV illumination. At least one distraction color is also selected, such that the distraction color exhibits low contrast against the background color(s) under UV illumination and exhibits high contrast against the background color(s) under normal illumination. One or more distraction patterns, formed from distraction color(s), is also selected.

BRIEF DESCRIPTION OF THE DRAWINGS

The foregoing and other features of the embodiments described herein will be apparent and easily understood from a further reading of the specification, claims and by reference to the accompanying drawings in which:

DETAILED DESCRIPTION

Figure 1:
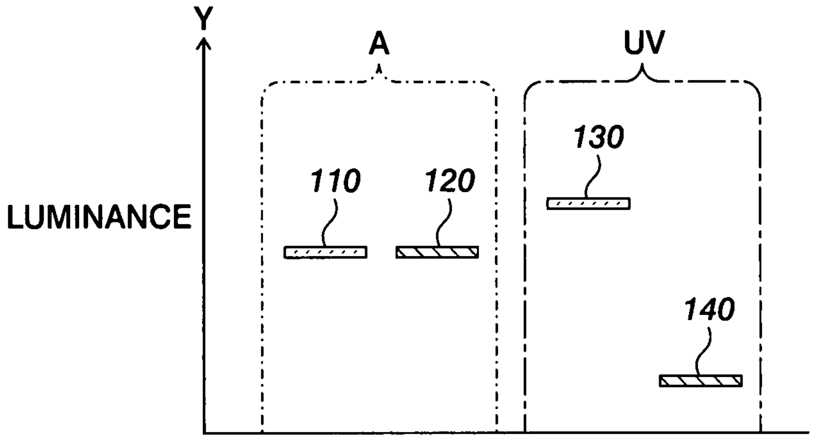
FIG. 1 is an illustration of one embodiment of the teachings for a substrate fluorescence mask according to the prior art.

In the following detailed description, reference is made to the accompanying drawings, which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the disclosure. The following detailed description is, therefore, not to be taken in a limiting sense.

For the purposes of clarity, the following term definitions are provided:

Color: A color can be uniquely described by three main perceptual attributes: hue, denoting whether the color appears to have an attribute according to one of the common color names, such as red, orange, yellow, green, blue, or purple (or some point on a continuum); colorfulness, which denotes the extent to which hue is apparent; and brightness, which denotes the extent to which an area appears to exhibit light. Light sources used to illuminate objects for viewing are typically characterized by their emission spectrum and to a reduced degree by their color temperature, which is primarily relevant for characterization of sources with a spectrum similar to a black body radiator. See, for instance, Hunt, R. W. G., *Measuring Colour*, Ellis Horwood, 1991, and Billmeyer and Saltzman, *Principles of Color Technology,* 3rd Ed. (Roy S. Berns), John Wiley & Sons, 2000.

Colorant: A dye, pigment, ink, or other agent used to impart a color to a material. Colorants, such as most colored toners, impart color by altering the spectral power distribution of the light they receive from the incident illumination through two primary physical phenomenon: absorption and scattering. Color is produced by spectrally selective absorption and scattering of the incident light, while allowing for transmission of the remaining light. For example, cyan, magenta and yellow colorants selectively absorb long, medium, and short wavelengths respectively in the spectral regions. Some colorants, such as most colored toners, impart color via a dye operable in transmissive mode. Other suitable colorants may operate in a reflective mode.

Fluorescence: An optical phenomenon whereby the molecular absorption of a photon triggers the emission of another photon with a longer wavelength. Usually the absorbed photon is in the ultraviolet range, and the emitted light is in the visible range.

Fluorescence Mark: A watermark embedded in the image that has the property of being relatively indecipherable under normal light, and decipherable under ultraviolet light.

Image: An image may be described as an array or pattern of pixels that are mapped in a two-dimensional format. The intensity of the image at each pixel is translated into a numerical value which may be stored as an array that represents the image. An array of numerical values representing an image is referred to as an image plane. Monochromatic or black and white (gray scale) images are represented as a two-dimensional array where the location of a pixel value in the array corresponds to the location of the pixel in the image. Multi-color images are represented by multiple two-dimensional arrays.

Illuminant: A source of incident luminous energy specified by its relative spectral power distribution.

Image plane: A two-dimensional representation of image data. For example, the uppercase letters C, Y, M, K are used to indicate two-dimensional arrays of values representing cyan, magenta, yellow and black components of a polychromatic (multicolor) image. Two-dimensional arrays of values may also be referred to as "planes". For example, the Y plane refers to a two-dimensional array of values that represent the yellow component at every location (pixel) of an image.

Composite Image: An array of values representing an image formed as a composite of plural overlaid (or combined) colorant image planes. Source images may be encoded as described herein and the resulting image planes are combined to form a composite image.

Imaging Device: A device capable of generating, capturing, rendering, or displaying an image; including devices that store, transmit, and process image data. A color imaging device has the capability to utilize color attribute information.

Luminance: A photometric measure describing the amount of light that passes through or is emitted from a particular area, and falls within a given solid angle. Luminance indicates how much luminous power will be perceived by the human eye looking at the surface from a particular angle of view. It is therefore an indicator of how bright a surface will appear.

Security document: A paper or document having a value such as to render it vulnerable to counterfeiting or unauthorized copying attempts.

It is known to utilize fluorescent material inks in combination with ultra-violet light sources for watermarking to ensure document security. See, for example, U.S. Pat. No. 3,614,430 to Berler; U.S. Pat. No. 4,186,020 to Wachtel; and U.S. Pat. No. 5,256,192 to Liu et al., each of which is hereby incorporated by reference in its entirety for its teaching. However, these inks are costly and are often difficult to incorporate into standard electrophotographic or other non-impact printing systems, such as solid ink printers, due to cost, availability or physical/chemical properties.

An alternate approach is to suitably mask the fluorescent properties found in standard paper substrates by the toners applied thereon to render a distinct image that is viewable under ultraviolet light but is not readily visible by an observer under normal light conditions. Examples of this approach are described in U.S. application Ser. No. 11/382,897 to Bala et al. ("Substrate Fluorescence Mask for Embedding Information in Printed Documents") and U.S. application Ser. No. 11/382,869 to Bala et al. ("Substrate Fluorescence Mask for Embedding Information in Printed Documents") both assigned to the same assignee of the present application and incorporated by reference in their entirety hereinabove. As described therein, it has been observed that common substrates used in digital printing contain optical brighteners that cause fluorescence. Standard colorants can act as an effective blocker of UV-induced emission. Of particular interest is the yellow colorant, which, is a strong inhibitor of UV-induced emission, and furthermore exhibits very low luminance contrast under normal illumination. This is due to the fact that yellow absorbs in the blue regime of the visible spectrum, and blue does not contribute significantly to perceived luminance.

In accordance with the '897 application, a fluorescent watermark (termed a "UV Mark") is embedded in a printed document by selectively masking substrate fluorescence with standard C, M, Y, K colorants and standard substrates used in digital color printing. A challenge in this approach is to design two colors that match under normal illumination, and yet exhibit significant contrast under UV light. This is conceptually illustrated in FIG. 1, where it is assumed, for the simplicity of illustration, that some form of luminance component (labeled Y) is used to describe the color of the patterns. In the standard case, the two colors 110 AND 120 should match under a normal illuminant (for example, illuminant A), but one color 130 would be considerably lighter than the other color 140 under UV illumination.

Figure 2:
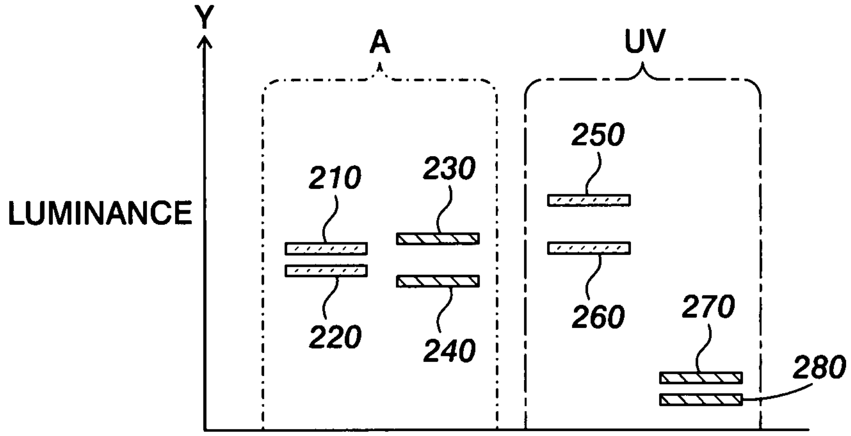
FIG. 2 is an illustration of another embodiment of the teachings for a substrate fluorescence mask according to the prior art.

As described in the '869 application, distraction patterns also may be utilized to obscure the visibility of the UV Mark under normal light. Distraction patterns may be created from two or more colors with the assumption that the interspersing of the colors will make the information unreadable under illuminant A. This is illustrated in FIG. 2, in which the four colors 210, 220, 230, and 240 almost match under illuminant A, but two clear groups form under UV illumination. In this illustration colors 250 and 260 appear brighter than colors 270 and 280 under UV. Distraction patterns may include unstructured random patterns, such as white noise, or structured patterns, such as a checkerboard. A difficulty with this approach is that there may be those situations in which significant contrast conceivably could still exist between the UV Mark and the background under normal illumination, especially since very often even normal light sources (e.g., sunlight) have some UV content and this cannot be carefully controlled or characterized.

Figure 3:
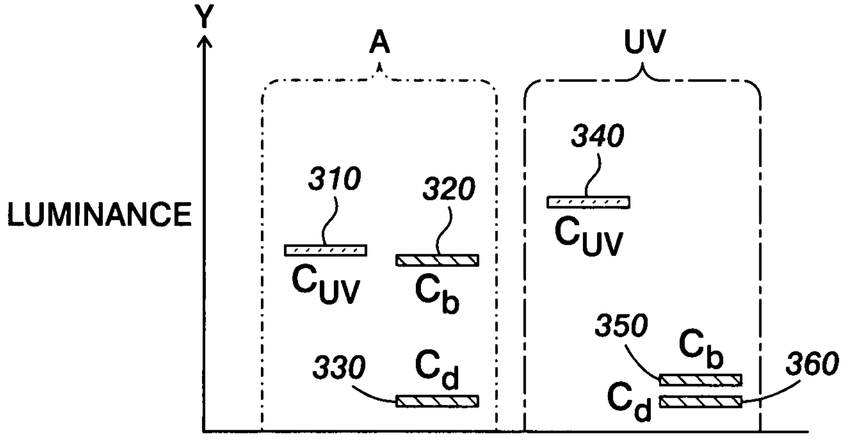
FIG. 3 is an illustration of the teachings herein for a multicolor substrate fluorescence mask.

The encryption approach described herein employs a minimum set of three colors in the UV mark: background color $C_b$, UV Mark color $C_{uv}$, and distraction color $C_d$ designed with the following properties. Under normal light, the UV mark color blends into the background, while the distraction text exhibits high contrast against the background and is thus strongly visible. Under UV light, the situation is reversed—the distraction color blends into the background and the UV text exhibits high contrast, becoming highly visible. This is illustrated in FIG. 3. As shown in FIG. 3, the contrast of the distraction pattern 330 against the background color 320 and the UV Mark color 310 under illuminant A, normal light, is sufficiently significant that any imprecision in the match between the UV Mark and background under illuminant A can be substantially masked by the high contrast noise. Under UV, the situation reverses and the grouping changes, effectively turning the "noise" color into signal. Here the contrast between the distraction pattern 360 and the background color 350 is not significant and the UV color 340 becomes readily visible.

In contrast to the approach illustrated in FIG. 2, a minimum of only three colors need to be defined, with effectively less stringent requirements on color matching. Simultaneously, the distraction amplitude under illuminant A is effectively eliminated under UV light, leading to a higher signal-to-noise ratio. An additional advantage to the three-color overlay approach as disclosed herein is that more aggressive distraction patterns may be utilized, since they disappear under UV illumination. The distraction pattern may be chosen to itself convey semantic content. Examples of semantic distraction patterns include text strings or icons. The advantage is that the user is more likely to be drawn towards a semantic distraction pattern than low-level image variations, and is thus less likely to notice and decipher a UV mark under normal light. This enables greater tolerance and robustness in the design of the UV Mark.

Figure 6:
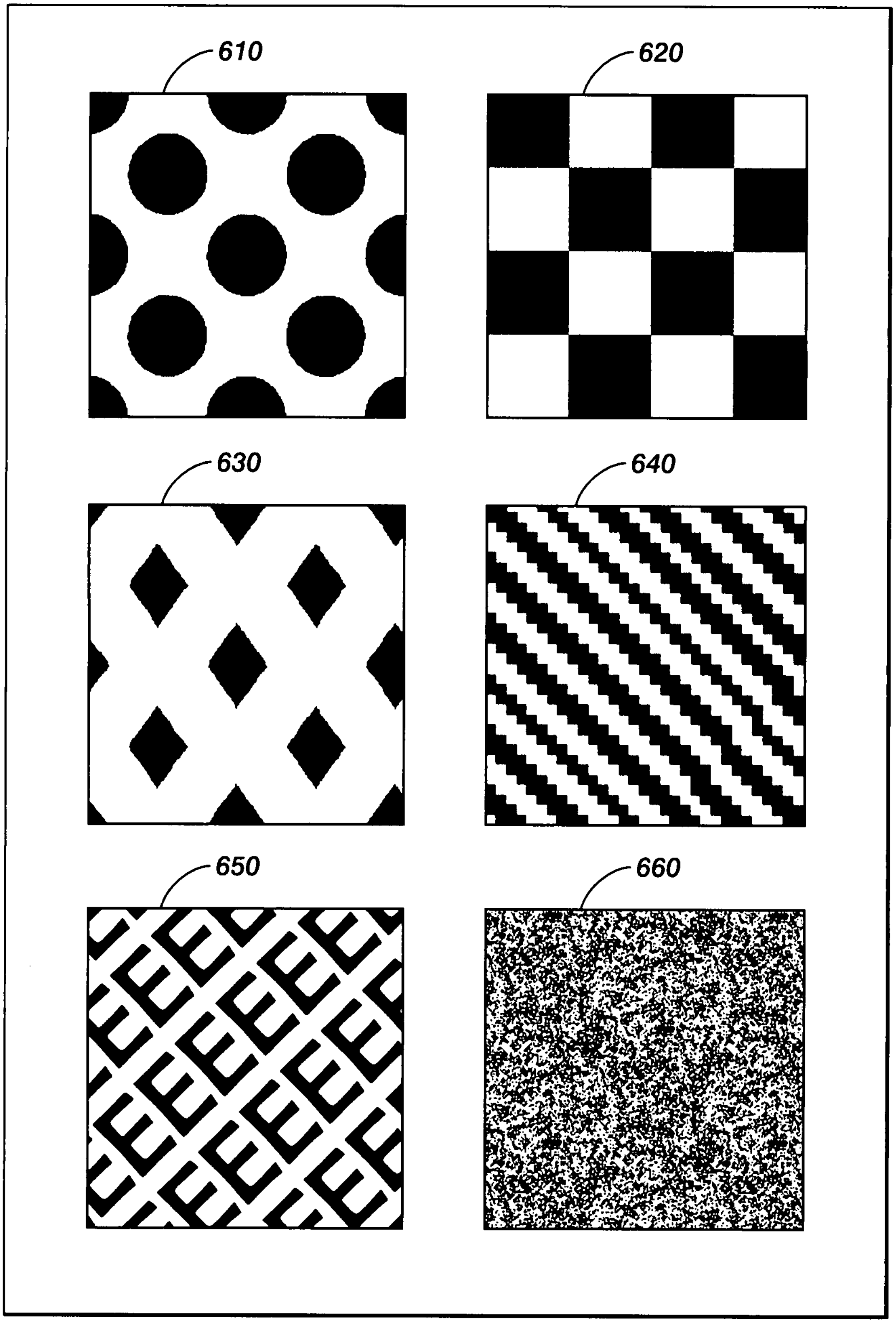
FIG. 6 illustrates example embodiments of alternative exemplary distraction patterns.

The concept could be generalized so that each of the 3 colors $C_b$, $C_{uv}$, and $C_d$ is replaced by a grouping of colors designed in spatial mosaics as taught in the '869 application. This would serve to introduce additional distraction noise, thus deterring the decipherability of the UV Mark under normal light. This is illustrated in FIG. 6, which shows examples of distracting patterns 610-650 that consist of repeating patterns, letters, or letter-like objects. As will be appreciated by those skilled in the art, other patterns can be derived from those provided in FIG. 6. The use of random noise patterns, rather than strictly repeating patterns, is also possible as is depicted by pattern 660.

Figure 4A:
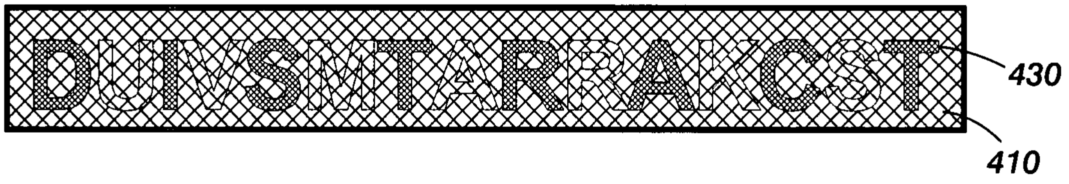
FIG. 4 is an illustration of one embodiment of a multicolor substrate fluorescence mask.
Figure 4B:
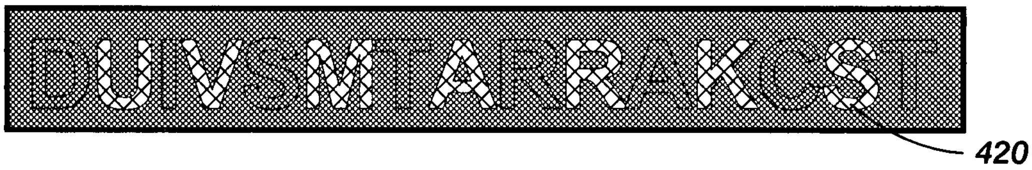

Referring to FIG. 4, there is shown an example embodiment of the substrate fluorescence mask utilizing a multiple color overlay. In this embodiment the background color $C_b$ (410) is solid yellow. The UV mark color $C_{uv}$ (420) used to encode the text string "UVMARKS" is a yellow tint chosen to produce low contrast against $C_b$ under normal light and high contrast under UV light. The distraction color $C_d$ (430) is a gray (C=M=Y or pure K) color designed to produce high contrast against $C_b$ under normal light, while blending into $C_b$ under UV light. It is used to form a semantic distraction pattern, the text string "DISTRACT" for this embodiment.

The particular methods performed for designing a substrate fluorescence mask comprise steps which are described below with reference to a series of flow charts. The flow charts illustrate an embodiment in which the methods constitute computer programs made up of computer-executable instructions. Describing the methods by reference to a flowchart enables one skilled in the art to develop software programs including such instructions to carry out the methods on computing systems. The language used to write such programs can be procedural, such as Fortran, or object based, such as C++. One skilled in the art will realize that variations or combinations of these steps can be made without departing from the scope of the disclosure herein.

Figure 5:
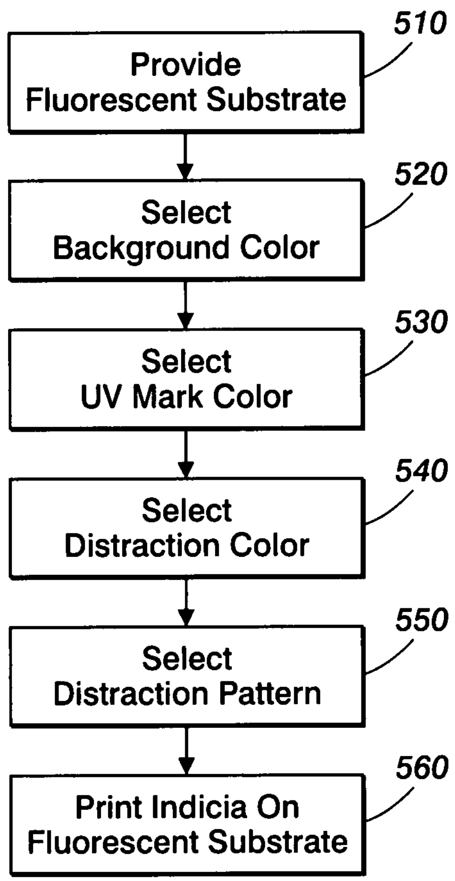
FIG. 5 is a flowchart outlining one exemplary embodiment of the method for embedding information utilizing a multicolor substrate fluorescence mask.

Turning now to FIG. 5, a flowchart illustrates the process for creating a UV Mark in accordance with the disclosure herein. At 510 a suitable printing substrate is provided. The substrate may be any white or colored digital printing substrate containing optical brightening agents to enhance the substrate's "whiteness" or "brightness". See, for example, U.S. Pat. No. 3,900,608 to Dierkes et al.; U.S. Pat. No. 5,371,126 to Strickler; or U.S. Pat. No. 6,773,549 to Burkhardt, each of which is hereby incorporated by reference in its entirety for its teaching. Paper is often marketed with a numeric indication of its brilliance. UV Marks have been successfully designed for brilliance numbers in the range of 80 and higher. In general, the higher the brilliance indicator, the better the quality of the resulting UV Mark.

The background color $C_b$ is selected at 520. In one example embodiment, the method for color selection is structured such that a user may select $C_b$, and the remaining two colors are automatically derived from the $C_b$ choice. The constraints applied for the selection of the background color $C_b$ are $$Y \geq \text{Threshold1}$$

$$C+M \leq \text{Threshold2}$$

$$K=0,$$

in which Y is yellow, C is cyan, M is magenta, and K is black. The first constraint ensures that there is sufficient yellow in the background to match a given level of K in the distraction text under UV light. The second constraint ensures that the background is light enough to exhibit visually significant contrast against the black (K) text under normal light. For example, the background color in FIG. 4 uses extreme values of Y=100%, C+M=0%. In additional experiments, Threshold1=100% and Threshold2=70% were used to algorithmically generate a set of 21 random background colors exhibiting a variety of green, yellow, and red hues as well as intermediate hue mixtures. In general the thresholds and the background colors are chosen heuristically based on a priori knowledge of the characteristics of a given printer, colorants and paper substrate.

The UV Mark color is then selected at 530. The UV Mark color $C_{uv}$ should exhibit low contrast against the background color $C_b$ under normal light and high contrast under UV light. One approach is to begin with $C_b$ and subtract a certain amount of yellow (denoted ΔY) to form $C_{uv}$. The magnitude of ΔY will determine the trade-off in visibility of the UV Mark under normal vs. UV light. In experiments, ΔY=25% was determined to yield an appropriate trade-off for the given printer, colorants and paper substrate. This amount was subtracted from $C_b$ to create $C_{uv}$. Alternatively, a more formal optimization technique could be used to adjust all four colorants to achieve a pair $C_b$ and $C_{uv}$ that minimizes color difference under normal light, and maximizes the UV luminance differential, or contrast. One exemplary method starts with a chosen background color $C_b$, and searches for the color $C_{uv}$ that minimizes the color difference between $C_{uv}$ and $C_b$ under normal light, subject to difference in luminance between $C_{uv}$ and $C_b$ under UV being greater than a predetermined threshold.

Alternatively, the optimization problem could be formulated to find the color $C_{uv}$ that maximizes the luminance differential with $C_b$ under UV subject to color difference under normal light being less than a predetermined threshold. Either optimization problem requires a color characterization or model for the printer that relates input CMYK to resulting printed color, as measured under both normal and UV light. With these models in place, the problem can be solved with standard optimization techniques such as sequential quadratic programming or gradient-descent methods, as are known in the art.

The distraction color $C_d$, selected at 540, is chosen to be a dark gray or black, since this will strongly stand out against the highly colored background $C_b$ under normal light. Additionally, since the distraction pattern is to blend into the background under UV light, the gray level is chosen so that the luminances of $C_d$ and $C_b$ match under UV light. The luminance match can be achieved via a characterization of the printer's luminance response under UV light. Such a characterization can be derived by measurement-based, model-based, or visual techniques. The distraction color $C_d$ can be generated with either pure K, process colorants (C=M=Y), or a combination thereof. Alternatively, the distraction color may be a non-neutral CMYK combination. In another embodiment, one or more of the colors $C_{uv}$, $C_d$, and $C_b$ could themselves be replaced by spatial mosaic patterns comprising multiple colorant combinations, as taught in the '869 application and discussed above with reference to FIG. 6 herein.

The distraction pattern is selected at 550. The three-color system described above in the example embodiment enables the use of a semantic distraction pattern, which can be implemented using a specially designed font (such as a font that interleaves the distraction text with the UV Mark text). Thus a full variable data path is enabled for both UV Mark and distraction pattern. The selected indicia are then printed on the fluorescent substrate by an imaging device at 560.

While the present discussion has been illustrated and described with reference to specific embodiments, further modification and improvements will occur to those skilled in the art. For example, the 3 colors or color groupings could be generated with other special colorants in addition to the standard C, M, Y, K. Examples of such colorants could include low-load colorants (commonly cyan and magenta), orange, green, violet, etc. Additionally, colored media that include OBAs could also be employed. Additionally, "code" as used herein, or "program" as used herein, is any plurality of binary values or any executable, interpreted or compiled code which can be used by a computer or execution device to perform a task. This code or program can be written in any one of several known computer languages. A "computer", as used herein, can mean any device which stores, processes, routes, manipulates, or performs like operation on data. It is to be understood, therefore, that this disclosure is not limited to the particular forms illustrated and that it is intended in the appended claims to embrace all alternatives, modifications, and variations which do not depart from the spirit and scope of the embodiments described herein.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A method for printing a substrate fluorescence mask on a substrate by a printing device for embedding information in printed documents, comprising:

providing a substrate comprising optical brightening agents;

receiving an indication from a user of at least one background color for the substrate fluorescence mask;

selecting, based on the received indication of at least one background color, at least one UV mark color for the substrate fluorescence mask to be printed on the substrate as a first text string in a line of text, wherein said UV mark color exhibits a first contrast against said at least one background color under a first illumination and a second contrast against said at least one background color under a second illumination having a higher UV illumination than the first illumination, wherein said second contrast is higher than said first contrast;

selecting, based on the received indication of at least one background color, at least one distraction color, wherein said distraction color exhibits a third contrast against said at least one background color under UV illumination and exhibits a fourth contrast against said at least one background color under the first illumination, wherein said fourth contrast is higher than said third contrast; and selecting at least one distraction pattern for the substrate fluorescence mask to be printed on the substrate in the distraction color as a second text string in the line of text which is interspersed with the first text string, wherein:

said UV mark color is selected to blend into the background color when illuminated with the first illumination and is readable when illuminated with the second illumination;

said distraction color is selected to blend into the background color when illuminated with the second illumination and is readable when illuminated with the first illumination; and the substrate fluorescence mask includes a plurality of color components that each corresponds to a process colorant of a plurality of process colorants:

the UV mark color, the distraction color, or each of both the UV mark color and the distraction color is a combination of two or more color components of the plurality of color components; and printing the background color on the substrate; and printing the line of text comprising the first text string in the UV mark color and the second text string in the distraction color interspersed with the first text string.

2. The method according to claim 1, wherein the substrate includes a white or colored digital printing substrate containing optical brightening agents.

3. The method according to claim 1, wherein said at least one background color, said at least one UV mark color, and said at least one distraction color are generated from at least one member selected from the group comprising:

CMYK colorants, low load colorants, orange, green, and violet.

4. The method according to claim 3, further comprising selecting said at least one background color with CMYK colorants applied, wherein selecting said at least one background color with CMYK colorants applied comprises:

applying a first constraint requiring that the yellow component of said at least one background color be greater than or equal to a first threshold, wherein said first threshold causes said at least one background color to include sufficient yellow to match a level of black or gray in said at least one distraction color under UV illumination;

applying a second constraint requiring that the sum of cyan and magenta components of said at least one background color is less than or equal to a second threshold, wherein said second threshold causes said at least one background color to be light enough to exhibit visually significant contrast against a black or gray distraction color under the first illumination; and applying a third constraint which excludes the presence of black in said at least one background color.

5. The method according to claim 4, wherein selecting said at least one background color and said first threshold is accomplished based on a priori knowledge of the characteristics of a specified printing device, colorants, and substrates.

6. The method according to claim 1, wherein selecting said at least one UV mark color comprises reducing the amount of yellow colorant in a selected at least one background color by a specified amount.

7. The method according to claim 1, wherein optimization techniques are utilized to select said at least one UV mark color and said at least one background color.

8. The method according to claim 7, wherein selecting said at least one UV mark color comprises performing optimization to identify a UV mark that minimizes the color difference between said at least one UV mark color and said at least one background color under the first illumination, subject to the difference in luminance between said at least one UV mark color and said at least one background color under UV light being greater than a specified threshold.

9. The method according to claim 7, wherein selecting said at least one UV mark color comprises performing optimization to identify a UV mark color that maximizes the luminance differential between said at least one UV mark color and said at least one background color under UV illumination, subject to the color difference between said at least one UV mark color and said at least one background color under the first UV illumination being less than a specified threshold.

10. The method according to claim 7, wherein said optimization techniques include at least one member selected from the group comprising quadratic programming and gradient-descent methods.

11. The method according to claim 1, wherein selecting said at least one distraction color comprises selecting at least one member from the group comprising process colorants, pure black, dark gray, or a combination thereof, subject to the luminance of said at least one distraction color and said at least one background color matching the luminance of said at least one distraction color and said at least one background color matching under UV illumination.

12. The method according to claim 1, wherein at least one of said background color, said UV mark color and said distraction color comprises a spatial mosaic pattern, wherein further the spatial mosaic pattern comprises multiple colorant combinations.

13. The method according to claim 1, wherein said distraction pattern comprises a semantic distraction pattern.

14. The method according to claim 13, wherein said semantic distraction pattern comprises an intelligible text string.

15. A method for embedding information in a printed document, comprising:

printing at least one background color of a fluorescence mask on a substrate, wherein the substrate comprises optical brightening agents;

printing a first text string with at least one mark color of the fluorescence mask on the substrate as part of a line of text such that the at least one mark color exhibits a first contrast against the at least one background color when exposed to a first light source and exhibits a second contrast against the at least one background color when exposed to a second light source which is different than the first light source, and the first contrast is higher than said second contrast; and printing a second text string with at least one distraction color of the fluorescence mask on the substrate as part of the line of text such that the at least one distraction color exhibits a third contrast against the at least one background color when exposed to the first light source and exhibits a fourth contrast against said at least one background color when exposed to the second light source, and the fourth contrast is higher than the third contrast, wherein:

the fluorescence mask includes a plurality of color components that each corresponds to a process colorant of a plurality of process colorants;

the UV mark color, the distraction color, or each of both the UV mark color and the distraction color is a combination of two or more color components of the plurality of color components;

characters of the first text string are interspersed with characters of the second text string within the line of text;

the first text string exhibits a higher contrast against the at least one background color than the second text string when the line of text is exposed to the first light source;

the second text string exhibits a higher contrast against the at least one background color than the first text string when the line of text is exposed to the second light source; and the at least one distraction color and the at least one mark color are selected based on a received indication from a user of the at least one background color.

16. The method of claim 15, wherein the mark color is a UV mark color and the first light source is a UV light source.

17. The method of claim 16, further comprising selecting the background color, the UV mark color, and the distraction color such that the UV mark color blends into the background color when exposed to the second light source and the distraction color blends into the background color when exposed to the UV light source.

18. The method of claim 15, further comprising:

selecting the mark color and the background color such that the first text string is readable when exposed to the first light source and blends into the background color when exposed to the second light source; and selecting the distraction color and the background color such that the second text string is readable when exposed to the second light source and blends into the background color when exposed to the first light source.

19. The method according to claim 1, wherein the plurality of process colorants consists of cyan, magenta, and yellow.

20. The method according to claim 15, wherein the plurality of process colorants consists of cyan, magenta, and yellow.

* * * * *